(12) United States Patent
Cho et al.

(10) Patent No.: US 12,480,211 B2
(45) Date of Patent: Nov. 25, 2025

(54) OXYGEN-DOPED AMORPHOUS CARBON FILM AND METHOD FOR DEPOSITING THE SAME

(71) Applicant: TES Co., Ltd, Yongin-si (KR)

(72) Inventors: Seong-Pyo Cho, Yongin-si (KR); Seung-Hwan Jeon, Yongin-si (KR); Nam-Seo Kim, Yongin-si (KR)

(73) Assignee: TES CO., LTD, Yongin-si (KR)

(*) Notice: Subject to any disclaimer, the term of this patent is extended or adjusted under 35 U.S.C. 154(b) by 3 days.

(21) Appl. No.: 18/432,288

(22) Filed: Feb. 5, 2024

(65) Prior Publication Data
US 2024/0263311 A1    Aug. 8, 2024

(30) Foreign Application Priority Data

Feb. 3, 2023   (KR) .......................... 10-2023-0015128

(51) Int. Cl.
| | | |
|---|---|---|
| *C23C 16/50* | (2006.01) | |
| *C23C 16/26* | (2006.01) | |
| *C23C 16/44* | (2006.01) | |
| *C23C 16/455* | (2006.01) | |
| *C23C 16/52* | (2006.01) | |

(52) U.S. Cl.
CPC .............. *C23C 16/50* (2013.01); *C23C 16/26* (2013.01); *C23C 16/4408* (2013.01); *C23C 16/45565* (2013.01); *C23C 16/52* (2013.01)

(58) Field of Classification Search
CPC ................ C23C 16/50; C23C 16/4408; C23C 16/45565; C23C 16/52; C23C 16/26; C23C 16/278; C23C 16/277; C23C 16/272; C23C 16/274; C23C 16/271
See application file for complete search history.

(56) References Cited

U.S. PATENT DOCUMENTS

| | | | | |
|---|---|---|---|---|
| 5,244,698 A | * | 9/1993 | Ishihara | .................. C23C 16/24 427/255.393 |
| 7,867,578 B2 | * | 1/2011 | Padhi | .................. C23C 16/5096 427/331 |

(Continued)

FOREIGN PATENT DOCUMENTS

| | | |
|---|---|---|
| KR | 10-2008-0079494 A | 9/2008 |
| KR | 10-2010-0112070 A | 10/2010 |

(Continued)

OTHER PUBLICATIONS

Korean Office Action for related KR Application No. 10-2023-0015128 mailed Oct. 31, 2024 from Korean Intellectual Property Office.

(Continued)

*Primary Examiner* — Michael P Wieczorek
(74) *Attorney, Agent, or Firm* — Paratus Law Group, PLLC

(57) ABSTRACT

Disclosed is a method for depositing an amorphous carbon film, the method including: (a) loading a substrate into a process chamber; (b) vacuumizing an inner space of the process chamber; and (c) converting hydrocarbon gas into plasma in the process chamber to deposit an amorphous carbon film on the substrate, wherein in the step (c), an oxygen-containing source is converted into plasma to dope oxygen into the deposited amorphous carbon film.

9 Claims, 6 Drawing Sheets

(56) References Cited

U.S. PATENT DOCUMENTS

| | | | |
|---|---|---|---|
| 2009/0011602 A1* | 1/2009 | Nozawa | H01L 21/31144 |
| | | | 438/694 |
| 2012/0100725 A1 | 4/2012 | Kikuchi | |
| 2023/0357921 A1 | 11/2023 | Weimer et al. | |

FOREIGN PATENT DOCUMENTS

| | | |
|---|---|---|
| KR | 10-1330516 B1 | 11/2013 |
| KR | 10-1881534 B1 | 7/2018 |
| KR | 10-2020-0084365 A | 7/2020 |
| KR | 10-2022-0018664 A | 2/2022 |
| TW | 201120943 A | 6/2011 |
| TW | 202233883 A | 9/2022 |

OTHER PUBLICATIONS

Taiwan Office Action for related TW Application No. 113104184 mailed Nov. 7, 2024 from Taiwan Intellectual Property Office.
Korean Notice of Allowance for related KR Application No. 10-2023-0015128 mailed Aug. 29, 2025 from Korean Intellectual Property Office.

* cited by examiner

OXYGEN-DOPED AMORPHOUS CARBON FILM AND METHOD FOR DEPOSITING THE SAME

CROSS-REFERENCE TO RELATED APPLICATION

This application claims priority from Korean Patent Application No. 10-2023-0015128 filed on Feb. 3, 2023 in the Korean Intellectual Property Office, and all the benefits accruing therefrom under 35 U.S.C. 119, the contents of which in its entirety are herein incorporated by reference.

BACKGROUND

Field

The present disclosure relates to deposition of an amorphous carbon film which is mainly used as a hard mask in a semiconductor manufacturing process. More specifically, the present disclosure relates to an oxygen-doped amorphous carbon film and a deposition method thereof.

Description of Related Art

In a NAND flash memory device manufacturing process that has recently been applied in the semiconductor manufacturing process, tens to hundreds of layers of silicon oxide and silicon nitride films are alternately stacked on a substrate, and only the silicon nitride films are selectively removed, and then a gate material of a transistor is deposited thereon to produce a semiconductor device.

In this regard, in order to selectively remove only the nitride films from a multilayer insulating film stack in which the silicon oxide and silicon nitride films are alternately stacked, a narrow and elongate hole that extends through vertically through the multilayer insulating film stack should first be formed through an etching process.

To form the hole that extends vertically through the multilayer insulating film stack, an amorphous carbon film (ACL) hard mask is generally deposited on top of the insulating film and etching is performed thereon. As the number of layers of a NAND flash memory device increases, a deposition thickness of the amorphous carbon film hard mask needs to be further increased in order for the amorphous carbon film hard mask to play its role properly. However, the increase in the deposition thickness of the amorphous carbon film hard mask causes problem in CD (Critical Dimension) as well as decreased productivity.

Korean Patent Application Publication No. 10-2008-0079494 (hereinafter referred to as Patent Document 1) proposes using liquid trimethylbenzene as an amorphous carbon source instead of $C_3H_6$ as a gaseous source, and injecting a carrier gas together therewith. In this method, the amorphous carbon gas is injected using the liquid amorphous carbon film source and the carrier gas was simultaneously injected to reduce a formation rate of the amorphous carbon film to strengthen a hardness of the film. However, when the liquid source is used as in the method according to Patent Document 1, a film that is not hard is basically formed. Thus, even when the carrier gas is also injected together therewith, an effect of improving the hardness of the amorphous carbon film formed is not significant.

SUMMARY

A purpose of the present disclosure is to provide a method for depositing an amorphous carbon film with excellent rigidity via PECVD process control.

Another purpose of the present disclosure is to provide an amorphous carbon film with excellent rigidity at a small thickness.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims or combinations thereof.

One aspect of the present disclosure provides a method for depositing an amorphous carbon film, the method comprising: (a) loading a substrate into a process chamber; (b) vacuumizing an inner space of the process chamber; and (c) converting hydrocarbon gas into plasma in the process chamber to deposit an amorphous carbon film on the substrate, wherein in the step (c), an oxygen-containing source together with the hydrocarbon gas are converted into plasma to dope oxygen into the deposited amorphous carbon film.

In one embodiment, the step (c) may be performed at a temperature of 610° C. or higher and a pressure of 20 Torr or lower.

In one embodiment, the step (c) may be performed at a pressure of 5 to 9 Torr.

In one embodiment, the oxygen-containing source may be oxygen gas. In one embodiment, the oxygen gas may be supplied at a flow rate of 40 to 140 sccm (standard cubic centimeter per minute). In one embodiment, the oxygen gas may be supplied at a flow rate of 80 to 120 sccm. In one embodiment, the oxygen-containing source may be selected from ozone gas, CDA (Clean Dry Air), $N_2O$ and water vapor.

In one embodiment, the hydrocarbon gas may be $C_3H_6$ and the oxygen-containing source may be oxygen gas.

In one embodiment, the hydrocarbon gas and the oxygen-containing source may contact each other in a space between a showerhead and a susceptor.

In one embodiment, the hydrocarbon together with at least one selected gas from Ar, He, and $N_2$ may be supplied to the process chamber.

In one embodiment, in the step (c), a thickness of the deposited amorphous carbon film may be controlled to about 2.7 to 3.0 μm.

One aspect of the present disclosure provides the oxygen-doped amorphous carbon film as manufactured using the above method, wherein the oxygen-doped amorphous carbon film includes a carbon matrix doped with oxygen and exhibits a modulus of about 38 MPa or greater.

In one embodiment, the amorphous carbon film may have a thickness of about 2.7 to 3.0 μm.

In one embodiment, the amorphous carbon film may have an extinction coefficient of about 0.55 to 0.64.

In one embodiment, the amorphous carbon film may be having compressive stress.

According to the oxygen-doped amorphous carbon film deposition method according to the present disclosure, the oxygen may be doped into the amorphous carbon film during the deposition of the amorphous carbon film via control of the PECVD process condition. Thus, the amorphous carbon film with excellent rigidity may be deposited.

According to the oxygen-doped amorphous carbon film deposition method according to the present disclosure, the amorphous carbon film with good modulus, extinction coefficient, etc. may be deposited, especially by controlling the flow rate of the oxygen gas.

Therefore, the deposited oxygen-doped amorphous carbon film may be used as a hard mask without significantly increasing the thickness of the amorphous carbon film, for example, even though the number of layers of a NAND flash memory device increases.

Effects of the present disclosure are not limited to the effects mentioned above, and other effects not mentioned will be clearly understood by those skilled in the art from the descriptions below.

DETAILED DESCRIPTIONS

Figure 1:
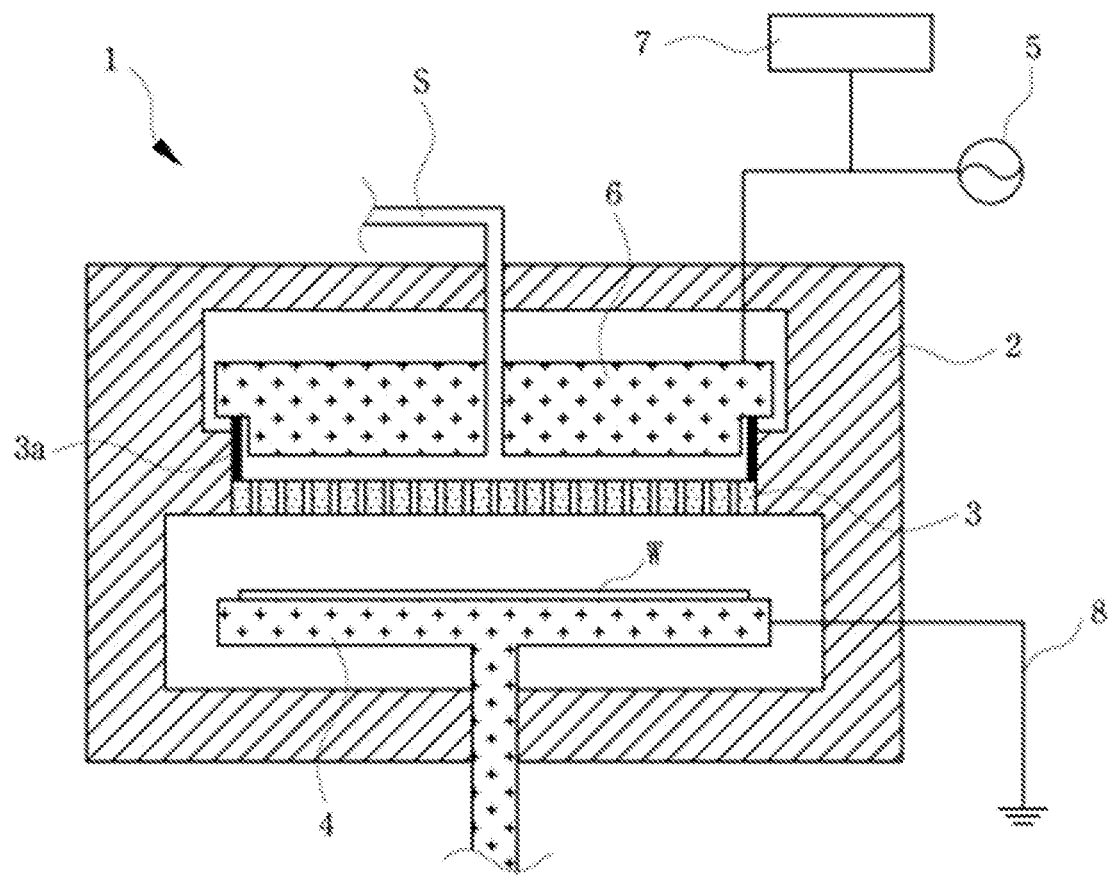
FIG. 1 schematically shows an example of a PECVD apparatus that may be used for an oxygen-doped amorphous carbon film deposition method according to the present disclosure.

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, with reference to the attached drawings, an oxygen-doped amorphous carbon film and a deposition method thereof according to a preferred embodiment of the present disclosure will be described in detail as follows.

In general, the amorphous carbon film refers to a film in which carbons are arranged in an amorphous state, unlike graphite in which carbons are arranged regularly. The amorphous carbon film has a high etching selectivity and high rigidity, making it suitable for use as a hard mask in the semiconductor manufacturing process, especially in a process that requires deep vertical etching. However, as a thickness of an etching target material increases, a thickness of the amorphous carbon film needs to increase in order to function as the hard mask until an end of the etching process. Increasing the thickness of the amorphous carbon film may cause problems such as decreased productivity and decreased CD (Critical Dimension) characteristics. Accordingly, as a result of long-term research, the inventors of the present disclosure have discovered a method for depositing the amorphous carbon film that may exhibit high rigidity by controlling a process condition of PECVD without increasing the thickness of the amorphous carbon film.

The amorphous carbon film is generally deposited on a substrate using the PECVD (Plasma Enhanced Chemical Vapor Deposition) process.

FIG. 1 schematically shows an example of a PECVD apparatus that may be used for the deposition method of the oxygen-doped amorphous carbon film according to an embodiment of the present disclosure.

Referring to FIG. 1, the PECVD apparatus 1 includes a process chamber 2, a showerhead 3, a susceptor 4, an RF power source 5, and a first electrode 6.

The showerhead 3 is provided at an upper portion in an inner space of the process chamber 2 and sprays gas injected thereto through a plurality of gas supply lines S connected to an external gas supply apparatus (not shown) into a treating space of the process chamber. In the present disclosure, the plurality of gas supply lines S may include a gas supply line for supplying hydrocarbon gas and a gas supply line for supplying an oxygen-containing source. Only the hydrocarbon gas may be supplied through the gas supply line for hydrocarbon gas supply. Alternatively, a carrier gas together with the hydrocarbon gas may be supplied through the gas supply line for hydrocarbon gas supply. Similarly, only the oxygen-containing source may be supplied through the gas supply line for supplying the oxygen-containing source. Alternatively, the carrier gas together with the oxygen-containing source through the gas supply line for supplying the oxygen-containing source. The carrier gas may be supplied through the gas supply line for supplying hydrocarbon gas and/or the gas supply line for supplying the oxygen-containing source, or may be supplied through a separate gas supply line for supplying the carrier gas. Since the hydrocarbon gas and the oxygen-containing source have a rather high reaction ability, it is desirable for the two gases to be in contact with each other within the process chamber 2. More preferably, the hydrocarbon gas and the oxygen-containing source contact each other in a space between the showerhead and the susceptor.

The first electrode 6 is electrically connected to the RF power source 5 and is used as an electrode for plasma discharge within the chamber 2. In the example shown in FIG. 1, the showerhead 3 is electrically connected (3a) to the first electrode 6, so that the first electrode 6 and the showerhead 3 function together as a single electrode. Accordingly, the RF power generated from the RF power source 5 is applied into the process chamber 2 through the first electrode 6 and the showerhead 3. A RF filter 7 serves to remove signal interference occurring around the process chamber 2.

The susceptor 4 on which a substrate W is loaded (supported) is provided at a lower portion of the inner space of the process chamber 2. The susceptor 4 may be provided with temperature control means for heating/cooling the substrate. Moreover, the susceptor 4 may function as a ground electrode, as in the example shown in FIG. 1. A separate ground line 8 may be provided to further improve grounding performance. Although not shown, the susceptor 4 may be connected to a high-frequency power source or a DC power source and thus the susceptor 4 itself may act as a second electrode (bias electrode).

An example of an oxygen-doped amorphous carbon film deposition method using the PECVD process is as follows.

The oxygen-doped amorphous carbon film deposition method according to the present disclosure first loads the substrate W onto the susceptor 4 inside the process chamber 2.

Afterwards, the inner space of the process chamber 2 is evacuated using an external vacuum system (not shown).

Afterwards, while supplying a reaction gas and a carrier gas is started, approximately 1000 to 3000 W of RF power is applied from the RF power source 5 to the first electrode 6 and the showerhead 3 and to the process chamber 2 to convert the hydrocarbon gas into plasma in the treating chamber between the showerhead 3 and the susceptor 4 to deposit the amorphous carbon film on the substrate.

According to the present disclosure, the hydrocarbon may be hydrocarbon including $C_2$-$C_6$ alkanes, $C_2$-$C_6$ alkenes, $C_2$-$C_6$ alkynes, or mixtures thereof. In an example, the hydrocarbon may include $CH_4$, $C_2H_2$, $C_3H_6$, $C_6H_6$, $C_6H_{12}$, $C_6H_{14}$, or mixtures thereof. Gaseous hydrocarbon may be supplied directly into the process chamber. Liquid hydrocarbon may be vaporized through a vaporizer and then supplied into the process chamber. The hydrocarbon used in the present disclosure is more preferably a gaseous hydrocarbon such as $C_3H_6$ for the purpose of forming a hard film. A supply amount of the hydrocarbon gas may be set to vary depending on a thickness of the amorphous carbon film to be deposited, a process chamber temperature, etc. For example, the hydrocarbon gas may be supplied at a flow rate of 500 to 1500 sccm. Moreover, the hydrocarbon gas together with the carrier gas may be supplied. The carrier gas may be helium gas (He), argon gas (Ar), nitrogen gas ($N_2$), etc. Each of one or more types of the carrier gas may be supplied into the process chamber at a flow rate of about 3000 sccm or smaller. For example, argon gas may be supplied into the process chamber at a flow rate of 2000 to 3000 sccm, helium gas may be supplied at a flow rate of 200 to 500 sccm, and nitrogen gas may be supplied into the process chamber at a flow rate of 1000 sccm or smaller. However, the present disclosure is not limited thereto.

In the present disclosure, the oxygen-containing source together with the hydrocarbon gas are converted to plasma such that the deposited amorphous carbon film is doped with oxygen. When the oxygen is doped into the amorphous carbon film, the rigidity of the deposited film may increase due to a bond between carbon and oxygen. Accordingly, even when the number of layers of silicon insulating films as the etching target increases, the oxygen-doped amorphous carbon film may function as a hard mask while maintaining CD (Critical Dimension) characteristics until end of the etching process of the silicon insulating films without or minimizing the increase in thickness of the amorphous carbon film.

In this regard, the deposition of the amorphous carbon film is preferably performed at a temperature of about 610° C. or higher, for example, 610 to 800° C. based on a substrate temperature. Raising the substrate temperature to about 610° C. or higher may allow a hard and dense amorphous carbon film to be deposited.

When depositing the oxygen-doped amorphous carbon film, an internal pressure of the process chamber 2 is preferably in a range of about 20 Torr or lower, more preferably, in a range of about 5 to 9 Torr. In general, the pressure exceeding about 20 Torr is undesirable because hydrocarbon such as propene ($C_3H_6$) and the oxygen-containing source such as $O_2$ are reactive. This low pressure serves to inhibit the oxygen-containing source and the hydrocarbon gas from reacting within the process chamber.

The oxygen-containing source may be oxygen gas. In this regard, the oxygen gas may be supplied at a flow rate of about 40 to 140 sccm. More preferably, the oxygen gas may be supplied at a flow rate of about 80 to 120 sccm. When the oxygen gas flow rate is lower than about 40 sccm, improvement in the rigidity of the deposited amorphous carbon film is insufficient. On the other hand, when the oxygen gas flow rate exceeds about 140 sccm, there is a high possibility that the amorphous carbon film etching by the oxygen may dominate over contribution to the film deposition via oxygen doping.

In another example, the oxygen-containing source may not be oxygen gas. For example, ozone gas, CDA (Clean Dry Air), $N_2O$, water vapor, etc. may be used as the oxygen-containing source.

In one example, in order to prevent the oxygen-containing source from reacting with the hydrocarbon gas in advance, the hydrocarbon gas and the oxygen-containing source may be separately supplied into a reaction chamber. More preferably, the hydrocarbon gas and the oxygen-containing source may be brought into contact only in the treating space between the showerhead and the susceptor.

Through the above process, the amorphous carbon film in which a carbon matrix doped with oxygen may be deposited. The amorphous carbon film manufactured by the method according to the present disclosure has compressive stress. Moreover, the amorphous carbon film manufactured by the method according to the present disclosure exhibits a modulus of 38 MPa or higher, which means that the amorphous carbon film manufactured by the method according to the present disclosure has high rigidity. This high rigidity allows the amorphous carbon film manufactured by the method according to the present disclosure to properly function as the hard mask in an etching process of a stack in which the number of oxide and nitride layers increases without increasing the thickness of the hard mask.

In the amorphous carbon film deposition method according to the present disclosure, the thickness of the deposited amorphous carbon film may be in a range of about 2.7 to 3.0 μm. The thickness of the amorphous carbon film may be adjusted based on a deposition time, a flow rate of the process gas, etc. In the present disclosure, the oxygen-doped amorphous carbon film for a hardmask with high rigidity may be deposited via use of a gaseous hydrocarbon source and control of the flow rate of the oxygen-containing source. Thus, even when the amorphous carbon film has the above thickness, the oxygen-doped amorphous carbon film may play its role properly as the hard mask in the etching process even though the number of oxide and nitride layers increases. Moreover, a deposition thickness of the oxygen-doped amorphous carbon film hard mask may suppress decline in CD characteristics caused by the increase in the deposition thickness.

The amorphous carbon film may have an extinction coefficient of about 0.55 to 0.64. The higher the extinction coefficient, the closer a color of the amorphous carbon film to black, and the higher a density of the film. In the present disclosure, the amorphous carbon film may have a sufficient extinction coefficient of about 0.55 or higher and thus may be highly dense. However, when the extinction coefficient is too high, that is, exceeds about 0.64, an alignment error between the amorphous carbon film and an underlaying layer increases. This is not desirable.

According to the oxygen-doped amorphous carbon film deposition method according to the present disclosure, the oxygen may be doped into the amorphous carbon film during deposition of the amorphous carbon film via control of the PECVD process condition. Thus, the amorphous carbon film with excellent rigidity may be deposited. According to the oxygen-doped amorphous carbon film deposition method according to the present disclosure, the amorphous carbon film with good modulus, extinction coefficient, etc. may be deposited, especially by controlling the flow rate of the oxygen gas. Therefore, the deposited oxygen-doped amorphous carbon film may be used as a hard mask in the semiconductor manufacturing process, for example, in the NAND flash memory device manufacturing process without significantly increasing the thickness of the amorphous carbon film even though the number of the oxide and nitride layers increases.

EXAMPLES

Hereinafter, a configuration and an effect of the present disclosure will be described in more detail through preferred examples of the present disclosure. However, the examples are presented as a desirable example of the present disclosure and should not be interpreted as limiting the present disclosure in any way.

Any information not described herein may be technically inferred by anyone skilled in the art. Thus, description thereof will be omitted.

Table 1 shows characteristics of the amorphous carbon film based on a flow rate of a deposition material.

The amorphous carbon films according to Comparative Example 1 and Present Examples 1 to 4 were deposited using PECVD under conditions of a process pressure of about 8 Torr, an RF power of about 2500 W, and a substrate temperature of about 610° ° C., in addition to the flow rate conditions of the process gases as listed in Table 1.

TABLE 1

| | | Comparative Example 1 | Present Example 1 | Present Example 2 | Present Example 3 | Present Example 4 |
|---|---|---|---|---|---|---|
| Process gas | $C_3H_6$ | 900 | 900 | 900 | 900 | 900 |
| | He | 500 | 500 | 500 | 500 | 500 |
| | Ar | 1400 | 1400 | 1400 | 1400 | 1400 |
| | $O_2$ | 0 | 80 | 100 | 120 | 140 |
| Film characteristics | Deposition rate (Å/s) | 57.2 | 51.7 | 51.0 | 49.7 | 48.6 |
| | Stress (Mpa) | 40 | −93 | −114 | −153 | −177 |
| | Modulus (Mpa) | 37.08 | 38.29 | 39.86 | 41.90 | 41.92 |
| | Surface roughness (Ra) | 0.434 | 0.535 | 0.446 | 0.467 | 0.475 |

Referring to Table 1, it may be identified that the amorphous carbon films according to each of Present Examples 1 to 4 have compressive stress and have a higher modulus compared to the amorphous carbon films according to Comparative Example 1. Due to this high modulus, a highly rigid, i.e. hard amorphous carbon film may be deposited.

Moreover, referring to Table 1, it may be identified that as the flow rate of the oxygen-containing source, that is, $O_2$, increases, the amorphous carbon film has greater compressive stress and the modulus also increases.

Moreover, referring to Table 1, it may be identified that the deposition rate of the amorphous carbon film according to each of Present Examples 1 to 4 is lower than the deposition rate of the amorphous carbon film according to Comparative Example 1. This low deposition rate contributes to densification or high density of the film.

Further, referring to Table 1, all of the amorphous carbon film specimens according to Comparative Example 1 and Present Examples 1 to 4 exhibited similar surface roughness (Ra; μm) values.

Figure 2:
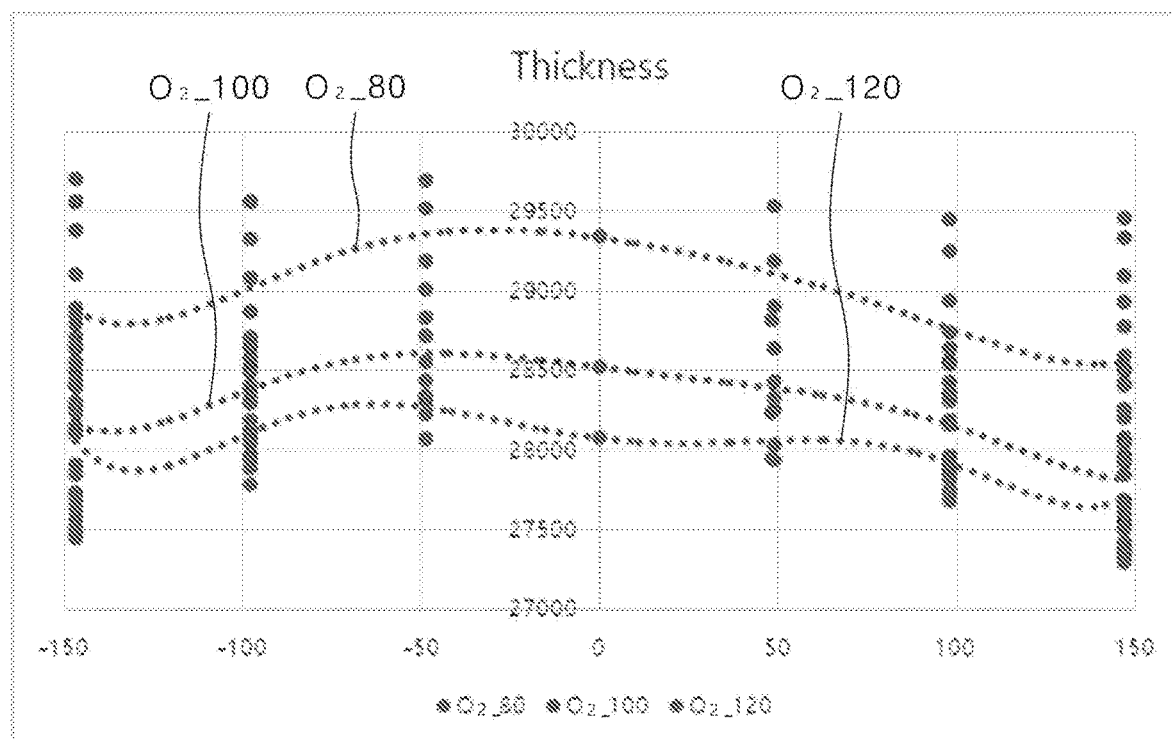
FIG. 2 shows a substrate position-based thickness based on an oxygen gas flow rate.

FIG. 2 shows a substrate position-based thickness based on the oxygen gas flow rate. In FIG. 2, 0 at a center of an X-axis represents a center of the wafer, and −150 and 150 in the X-axis refer to one edge and the other edge of the wafer opposite to each other.

Referring to FIG. 2, it may be identified that the amorphous carbon films according to each of Present Examples 1 to 3 where the oxygen gas flow rates of 80 sccm, 100 sccm and 120 sccm are applied, respectively have a thickness of 27,000 to 30,000 Å, that is, 2.7 to 3.0 μm.

Further, it may be identified that a thickness deviation is gradually decreasing as the oxygen gas flow rate increases from 80 sccm to 120 sccm.

Figure 3A:
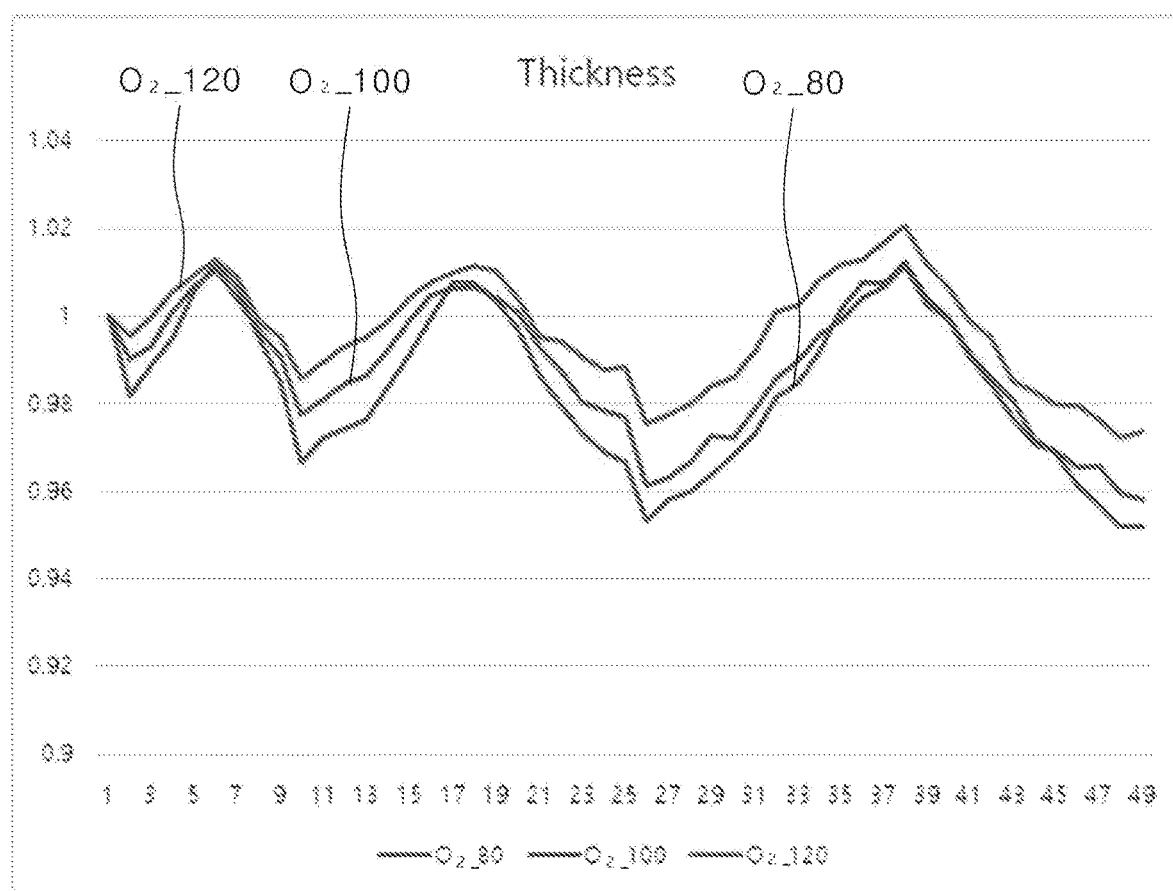
FIG. 3A and FIG. 3B show a wafer position-based relative thickness based on an oxygen gas flow rate.
Figure 3B:
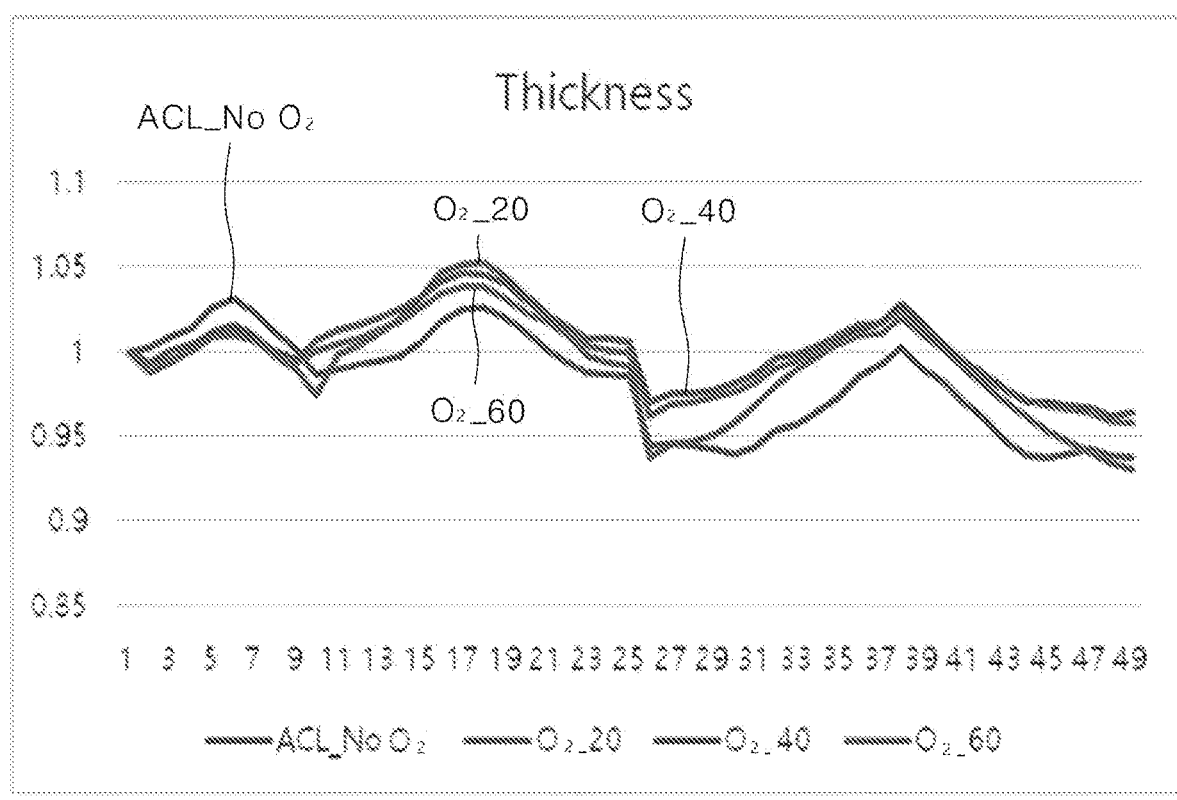

FIG. 3A and FIG. 3B show a wafer position-based relative thickness based on the oxygen gas flow rate.

Figure 4:
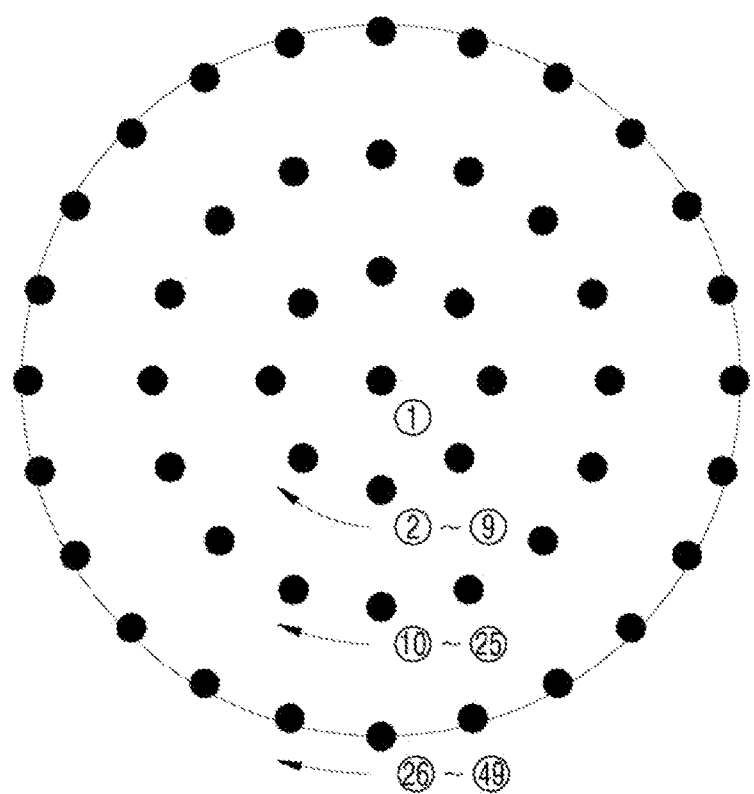
FIG. 4 shows 49 points on the wafer used in FIG. 3A and FIG. 3B.

In FIG. 3A and FIG. 3B, the numbers in an X-axis indicate 49 points on the wafer which are shown in FIG. 4. Moreover, in FIG. 3, a thickness at a center of the wafer (position 1) is set to 1, and thicknesses at different positions were expressed relative to the thickness at the center of the wafer.

In Comparative Example 2 and Present Examples 5 to 6, the amorphous carbon films were deposited under the same process conditions as those of Present Examples 1 to 3 except for the oxygen gas flow rate.

Referring to FIG. 3A and FIG. 3B, it may be identified that all of the amorphous carbon films according to Comparative Examples 1 to 2 and Present Examples 1 to 3, 5, and 6 in which the oxygen gas flow rates of 0 sccm, 20 sccm, 40 sccm, 60 sccm, 80 sccm, 100 sccm, and 120 sccm are applied, respectively have similar thickness profiles based on the wafer position.

However, it may be identified that as the oxygen gas flow rate increases, the thickness deviation gradually decreases.

Table 2 shows the thickness deviation of each of the amorphous carbon films according to Present Examples 1 to 3 in which oxygen gas flow rates of 80 sccm, 100 sccm and 120 sccm are applied, respectively, and Present Examples 5 and 6 in which oxygen gas flow rates of 40 sccm and 60 sccm are applied, respectively.

The thickness deviation was calculated by subtracting the smallest thickness from the largest thickness of the film, based on the relative thicknesses in FIG. 3A and FIG. 3B.

Moreover, it may be identified that as the flow rate of oxygen gas increases, the extinction coefficient (K) gradually increases.

Moreover, as the flow rate of oxygen gas increases, a difference between the extinction coefficients of the edge and the center of the wafer decreases.

Table 3 shows characteristics of the film based on the oxygen gas flow rate.

TABLE 3

| | Examples | | | |
|---|---|---|---|---|
| | Present Example 1 | Present Example 2 | Present Example 3 | Present Example 4 |
| $O_2$ flow rate (sccm) | 80 | 100 | 120 | 140 |
| Thickness non-uniformity (%) | 3.1 | 2.7 | 2.4 | 2.3 |
| Extinction coefficient non-uniformity (%) | 2.52 | 1.99 | 1.60 | 1.32 |

Referring to Table 3, it may be identified that in the deposition of the amorphous carbon films according to Present Examples 1 to 4, as the flow rate of oxygen gas increases, each of the thickness non-uniformity and the

TABLE 2

| Examples | Comparative Example 1 | Comparative Example 2 | Present Example 5 | Present Example 6 | Present Example 1 | Present Example 2 | Present Example 3 |
|---|---|---|---|---|---|---|---|
| $O_2$ flow rate (sccm) | 0 | 20 | 40 | 60 | 80 | 100 | 120 |
| Thickness deviation | 0.09428 | 0.12207 | 0.08472 | 0.08071 | 0.06048 | 0.05333 | 0.04839 |

Referring to FIG. 3A and Table 2, it may be identified that the thickness deviation is gradually decreasing as the oxygen gas flow rate increases from 0 sccm to 120 sccm. In particular, it may be identified that the thickness deviation is greater in Comparative Example 2 where the oxygen gas flow rate is only 20 sccm, and Present Example 5 where the oxygen gas flow rate is 40 sccm. Therefore, based on Table 2, it may be identified that the oxygen gas flow rate is preferably 40 to 120 sccm.

Figure 5:
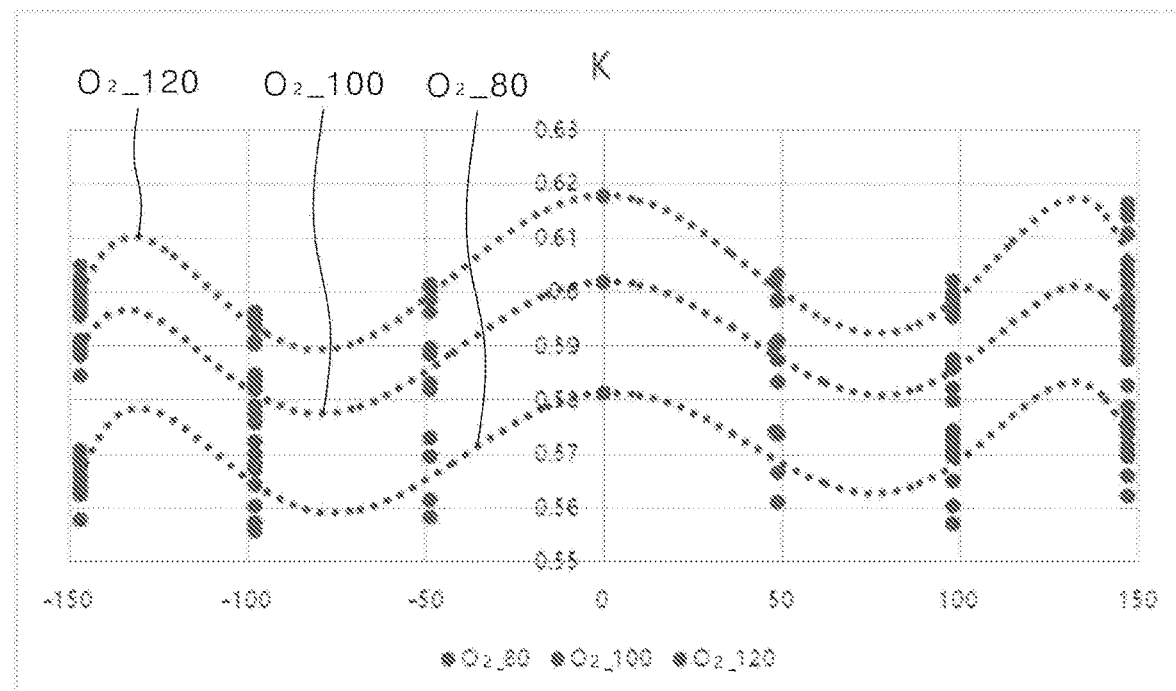
FIG. 5 shows a substrate position-based extinction coefficient based on an oxygen gas flow rate.

FIG. 5 shows the substrate position-based extinction coefficient based on the oxygen gas flow rate.

In FIG. 5, as the extinction coefficient or K value increases, the color of the amorphous carbon film is closer to black and the density of the film increases.

extinction coefficient non-uniformity decreases, that is, each of the thickness uniformity and the extinction coefficient uniformity tend to increases.

Table 4 shows a result of checking whether the amorphous carbon film is peeled off depending on the oxygen gas flow rate.

The amorphous carbon film being peeled off means that significant etching has occurred. The deposited amorphous carbon film was observed and the peel-off is expressed as follows:

The amorphous carbon film does not peel off at all: ◉

The amorphous carbon film is slightly peeled off: ○

Multiple amorphous carbon films peeled off: X

TABLE 4

| Examples | Comparative Example 1 | Present Example 1 | Present Example 2 | Present Example 3 | Present Example 4 | Comparative Example 3 |
|---|---|---|---|---|---|---|
| O2 flow rate (sccm) | 0 | 80 | 100 | 120 | 140 | 160 |
| Peel-off | ◉ | ◉ | ◉ | ◉ | ○ | X |

Referring to FIG. 5, it may be identified that all of the amorphous carbon films according to Present Examples 1 to 3 in which oxygen gas flow rates of 80 sccm, 100 sccm, and 120 sccm are applied, respectively have the extinction coefficient (K) in a range of 0.55 to 0.64.

Referring to Table 4 above, it may be identified that even though the oxygen gas was included in the process gas, the amorphous carbon film is not peeled off when the flow rate of oxygen gas increases up to 120 sccm. Insignificant peeling off occurs under the condition of 140 sccm of oxygen gas. However, under the condition of 160 sccm of oxygen gas, the peeling off of the amorphous carbon film is significant because etching dominates over deposition.

Therefore, based on Table 4, the flow rate of oxygen gas in accordance with the present disclosure is preferably 140 sccm or lower, more preferably, 80 to 120 sccm.

Although the embodiments of the present disclosure have been described in more detail with reference to the accompanying drawings, the present disclosure is not necessarily limited to the embodiments, and may be modified in a various manner in the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

What is claimed is:

1. A method for depositing an amorphous carbon film, the method comprising:
    (a) loading a substrate into a process chamber;
    (b) vacuumizing an inner space of the process chamber; and
    (c) converting hydrocarbon gas into plasma in the process chamber to deposit an amorphous carbon film on the substrate,
    wherein in the step (c), an oxygen-containing source is converted into plasma to dope oxygen into the deposited amorphous carbon film,
    wherein the hydrocarbon gas and the oxygen-containing source contact each other in a space between a showerhead and a susceptor.

2. The method of claim 1, wherein the step (c) is performed at a temperature of about 610° C. or higher and a pressure of about 20 Torr or lower.

3. The method of claim 2, wherein the step (c) is performed at a pressure of about 5 to about 9 Torr.

4. The method of claim 1, wherein the oxygen-containing source is oxygen gas.

5. The method of claim 4, wherein the oxygen gas is supplied at a flow rate of about 40 to about 140 sccm.

6. The method of claim 5, wherein the oxygen gas is supplied at a flow rate of about 80 to about 120 sccm.

7. The method of claim 1, wherein the oxygen-containing source is selected from ozone gas, CDA (Clean Dry Air), $N_2O$ and water vapor.

8. The method of claim 1, wherein the hydrocarbon gas is $C_3H_6$ and the oxygen-containing source is oxygen gas.

9. The method of claim 1, wherein the hydrocarbon gas together with at least one selected gas from Ar, He, and $N_2$ are supplied to the process chamber.

* * * * *